United States Patent
Hietanen et al.

(10) Patent No.: US 7,375,340 B2
(45) Date of Patent: May 20, 2008

(54) PACKAGING STRUCTURE FOR IMAGING DETECTORS

(75) Inventors: Iiro Hietanen, Härkäpää (FI); Mikko Juntunen, Kirkkonummi (FI)

(73) Assignee: Detection Technology Oy, Micropolis (FI)

( * ) Notice: Subject to any disclaimer, the term of this patent is extended or adjusted under 35 U.S.C. 154(b) by 165 days.

(21) Appl. No.: 10/523,943

(22) PCT Filed: Aug. 12, 2003

(86) PCT No.: PCT/FI03/00602

§ 371 (c)(1),
(2), (4) Date: Aug. 25, 2005

(87) PCT Pub. No.: WO2004/017429

PCT Pub. Date: Feb. 26, 2004

(65) Prior Publication Data

US 2006/0065841 A1   Mar. 30, 2006

(30) Foreign Application Priority Data

Aug. 15, 2002 (GB) ................... 0219044.5

(51) Int. Cl.
  *G01T 1/24* (2006.01)
(52) U.S. Cl. ................................. 250/370.09
(58) Field of Classification Search ............ 250/370.09
  See application file for complete search history.

(56) References Cited

U.S. PATENT DOCUMENTS

| | | | |
|---|---|---|---|
| 4,826,777 A | 5/1989 | Ondris | |
| 5,227,656 A * | 7/1993 | Timlin et al. | 257/441 |
| 5,352,884 A | 10/1994 | Petrick et al. | |
| 5,371,351 A | 12/1994 | Van Berkel | |
| 5,635,718 A | 6/1997 | DePuydt et al. | |
| 5,786,597 A * | 7/1998 | Lingren et al. | 250/370.09 |
| 6,002,134 A | 12/1999 | Lingren | |
| 6,369,853 B1 | 4/2002 | Merrill et al. | |
| 2002/0017612 A1 | 2/2002 | Yu et al. | |
| 2002/0153492 A1 * | 10/2002 | Sekine et al. | 250/370.11 |

FOREIGN PATENT DOCUMENTS

| | | |
|---|---|---|
| EP | 0 287 228 A1 | 10/1988 |
| EP | 0 446 861 A1 | 9/1991 |
| EP | 1 045 450 A2 | 10/2000 |

* cited by examiner

*Primary Examiner*—Djura Malevic

(57) ABSTRACT

There is disclosed a photo-detector array including a plurality of sub-arrays of photo-detectors, the photo-detectors of each sub-array being formed of: a plurality of anodes formed at a first surface of at least one substrate; a corresponding plurality of cathodes formed at a second surface of at least one substrate; and an electrical interconnection between the plurality of anodes, whereby outputs of the array are provided by the plurality of cathodes, wherein a plurality of said sub-arrays of photo-detectors are placed adjacent to each other in a matrix to form the photo-detector array.

35 Claims, 13 Drawing Sheets

PACKAGING STRUCTURE FOR IMAGING DETECTORS

FIELD OF THE INVENTION

The present invention relates to semiconductor devices, and particularly but not exclusively to photo-detectors for use in imaging systems.

BACKGROUND OF THE INVENTION

Photo-detectors are used in imaging systems for medical, security and industrial applications. One particular medical application of photo-detectors is in computed tomography (CT) systems.

In a typical CT system, an X-ray source with a fan-shaped X-ray beam and a two-dimensional radiation detector array are assembled on a mechanical support structure, known as a gantry. In use, the gantry is rotated around an object to be imaged in order to collect X-ray attenuation data from a constantly changing angle with respect to the object. The plane of the gantry rotation is known as an imaging plane, and it is typically defined to be the x-y plane of the coordinate system in a CT system. In addition, the gantry (or more typically the object) is moved slowly along the z-axis of the system in order to collect x-ray attenuation data for a required length of the object. Examples of current CT systems are discussed in U.S. Pat. Nos. 6,144,718 and 6,173,031.

The radiation detectors of current state of the art CT systems consist of a two-dimensional array of rare earth metal based scintillators and a corresponding two-dimensional array of silicon photodiodes. Both the scintillator crystals and the photodiodes are manufactured in two-dimensional arrays, which are then optically coupled to one another during detector manufacturing.

A typical state of the art detector array is shown in FIG. 1. A typical detector consists of an array of 16 rows and 16 columns of individual detector elements, i.e. 256 elements in total. Columns are organised in the z direction. The construction of the detector is well-known in the art. The array of detectors is generally illustrated in FIG. 1 by reference numeral 2. The z direction or z-axis is also shown in FIG. 1. The elements in rows are in the imaging plane, and produce sets of data known as 'slices'. In a medical CT machine, for example, each slice image corresponds to a two-dimensional X-ray image of a thin slice of a human body as seen in the direction of the body axis and the machine z-axis.

In CT imaging systems, the size of the detector in the imaging plane is increased by placing individual detector arrays, such as the array shown in FIG. 1, adjacent to each other to thereby increase the size of the detector in the imaging plane. An edge 4 of the detector of FIG. 1 may be placed alongside a corresponding edge of a corresponding detector array, and thereby a larger area can be built up.

A key trend in the CT industry is to build CT machines with more detector elements in order to collect more X-ray attenuation data for each gantry rotation and therefore to speed up the measurements, to improve the accuracy of the measurements, and to decrease patient radiation dose in medical applications. An increase in the number of detector elements similarly may have advantages in other imaging applications, and is not restricted to medical or CT systems.

In current CT detector constructions, a major limiting factor in providing more detector elements is the need to readout the electrical signals from the individual photo-detectors of the detector array. In the current art, the readout of these signals is facilitated by manufacturing very narrow metal lines (typically 5 to 20 µm) on top of the photo-detector chip, between the active photo-detector elements. A single metal line carries the signal of one photo-detector to the edge of the photo-detector chip, in the z direction, to an area which is specially reserved for the purpose of connecting the signals from the photo-detectors by wire bonding to a substrate placed beneath the photo-detector chip or to a multiplexing or signal processing ASIC chip. Using this method, there is a physical limitation on the size of a photo-detector array that may be manufactured. The number of electrical elements at the chip edge is limited, and this limits the number of photo-detector elements which can be connected. The detector cannot get larger in the z-direction in particular.

This is illustrated by FIG. 1. The photo-detector array 2 is provided with an area 6 and 8 either side of the array in the z direction, which areas provide for connection to a respective set of electrical wires, 10 and 12. The signals from the photo-detector array may be multiplexed or processed in integrated electronics chips or ASICs located in areas 6 and 8 before the signals are connected to electrical wires, 10 and 12. Because of the need to accommodate the physical wires and their connections, the number of photo-detectors in an array is limited. In particular, it is not possible to add further photo-detectors in the z direction. The physical wires 10 and 12 prevent any expansion of the photo-detector array in the z direction, such that additional photo-detector arrays cannot be added in the z direction. That is, although photo-detectors can be joined together side-by-side, in the horizontal direction in FIG. 1, they cannot be joined to top-to-bottom, in the vertical direction. This is because of the need to connect the wires 10 and 12 at the top and bottom.

A photo-detector with the possibility of expansion in the z direction is known as a 'tileable' detector. In order to provide a tileable detector, it is necessary to make the electrical connections to each photo-detector without wiring the photo-detectors to the photo-detector chip edge. If this can be achieved, there is no limit to the growth of the photo-detector array and consequently the number of photo-detector elements.

One solution to the problem of achieving a tileable detector is suggested in U.S. Pat. No. 6,396,898.

Embodiments of the present invention aim to address one or more of the above problems and to provide an improved photo-detector array.

SUMMARY OF THE INVENTION

The invention enables the manufacture of fully 'tileable' detector structures with highly uniform detector properties.

According to the present invention there is provided an array of photodiodes comprising: a plurality of anodes formed at a first surface of at least one substrate; a corresponding plurality of cathodes formed at a second surface of at least one substrate; and an electrical interconnection between the plurality of anodes, whereby outputs of the array are provided by the plurality of cathodes.

The plurality of anodes and the plurality of cathodes may be formed at the first and second surfaces of a corresponding plurality of substrates. The plurality of substrates may be formed by dividing a single substrate. The plurality of cathodes may comprise a plurality of conductive layers formed at the surface of the substrate. There may further be provided a metal layer on each conductive layer. The plurality of anodes may comprise a plurality of active regions formed at the first surface. There may further be provided a metal contact for each active region.

The electrical interconnection may be provided by wire bonding. The electrical interconnection may be provided by metal contacts. The electrical interconnection may be provided by a conductive sheet.

There may further be provided a connector interface, the connector interface being provided with a plurality of contacts for contacting the plurality of cathodes. The at least one substrate may be formed on the connector interface. The plurality of contacts may be connected to the plurality of cathodes by an epoxy.

An imaging system may preferably include such an array. A CT imaging system may include such an array.

According to the present invention there is further provided a photo-detector array including a plurality of sub-arrays of photo-detectors, the photo-detectors of each sub-array being formed of: a plurality of anodes formed at a first surface of at least one substrate; a corresponding plurality of cathodes formed at a second surface of at least one substrate; and an electrical interconnection between the plurality of anodes, whereby outputs of the array are provided by the plurality of cathodes, wherein a plurality of said sub-arrays of photo-detectors are placed adjacent to each other in a matrix to form the photo-detector array.

The matrix preferably extends in two directions.

An imaging system may comprise: a radiation detector including a photo detector array as defined, a radiation source facing the radiation detector, and means for controlling the radiation detector and the radiation source. The radiation source may be an X-ray tube equipped with a high-voltage generator.

The radiation detector and the radiation source may be radially mounted in a cylindrical scanning structure. The means for controlling may comprise a computer system.

According to a further aspect of the present invention there is provided a method of forming an array of photo-diodes, comprising: forming a plurality of anodes at a first surface of at least one substrate; forming a corresponding plurality of cathodes at a second surface of the at least one substrate; and electrically interconnecting the plurality of anodes such that the plurality of cathodes provide the outputs of the array.

The step of forming a plurality of cathodes may comprise providing a plurality of conductive layers on the second surface of the at least one substrate. The plurality of anodes and the plurality of cathodes may be formed from a single substrate.

The plurality of conductive layers may be formed by providing a continuous conductive layer on the second surface of the substrate, and electrically isolating portions of the continuous layer to form the plurality of conductive layers.

The portions of the conductive layer may be electrically isolated by etching or cutting the continuous conductive layer. The step of etching or cutting may further etch the substrate. The substrate may be etched or cut completely. There is thus preferably formed a plurality of isolated substrate portions.

The etch or cut may be patterned such that a contiguous area is etched or cut around each cathode. The plurality of anodes and the plurality of cathodes may be formed from a respective plurality of substrates.

The step of interconnecting the plurality of anodes may include forming wire bonding between anodes on the first surface of the substrate. The step of interconnecting the plurality of anodes may include providing a metal interconnect between anodes on the first surface of the substrate. The step of interconnecting the plurality of anodes may include providing a conductive sheet over the first surface.

The method may further comprise the step of connecting the plurality of cathodes to a connector interface. The connector interface may include a plurality of pads for connection to the plurality of cathodes. The connector interface may comprise a substrate.

The connector interface may comprise an integrated circuit.

According to a still further aspect of the present invention there is provided a semiconductor structure comprising an array of photo-diodes each having an anode and a cathode, in which the anodes are electrically connected and the cathodes are electrically isolated.

The anodes may be formed on one surface of a substrate and the cathodes may be formed on another surface of the substrate. The cathodes may be electrically isolated by openings through the semiconductor structure. An opening through the semiconductor device surrounds each anode. The anodes may be electrically connected by wire bonding. The anodes may be electrically connected by a sheet of material.

The sheet of material may be formed over the surface of the device.

In a further aspect, the present invention provides an array of photodiodes, each photodiode comprising a substrate having an active area comprising an anode formed in a first surface thereof and a cathode formed on a second surface thereof, wherein the anodes of the array are electrically interconnected, the cathodes providing the outputs of the photodiode array.

In a further aspect, the present invention provides a method of manufacturing an array of photo-diodes comprising forming a plurality of active areas forming anodes in a first surface of the device and at least one cathode formed on a second surface of the device, the method comprising: electrically connecting the anodes, and electrically isolating the cathodes.

BRIEF DESCRIPTION OF DRAWINGS

For better understanding of the present invention, and to show as to how the same may be carried into effect, reference will now be made by way of example to the accompanying drawings in which.

DESCRIPTION OF PREFERRED EMBODIMENTS OF THE INVENTION

The present invention is described hereinafter with reference to a particular set of embodiments. However the invention is not limited to such embodiments.

The invention is particularly described herein with reference to an example of a photo-detector array for a CT medical imaging system.

It should be noted that whilst the invention is illustrated herein by way of reference to various figures, none of these figures are drawn to scale, but rather are drawn to best illustrate various features of the present invention.

With reference to FIGS. 2 to 6 there are illustrated various embodiments showing selected steps in the manufacture of a photo-detector array in accordance with embodiments of the present invention. A cross-section through an exemplary device substrate is used for the purpose of explaining the present invention. In the presented embodiments photo-detector elements may form a one or two-dimensional array of elements. All manufacturing steps presented in FIGS. 2 to 6 are illustrated as cross-sectional drawings of a one-dimensional array of elements. However, all manufacturing steps presented may be equally applied to a two dimensional array of photo-detector elements. Only those steps relevant to an understanding of the present invention are shown. Other steps will be familiar to one skilled in the art.

Figure 1:
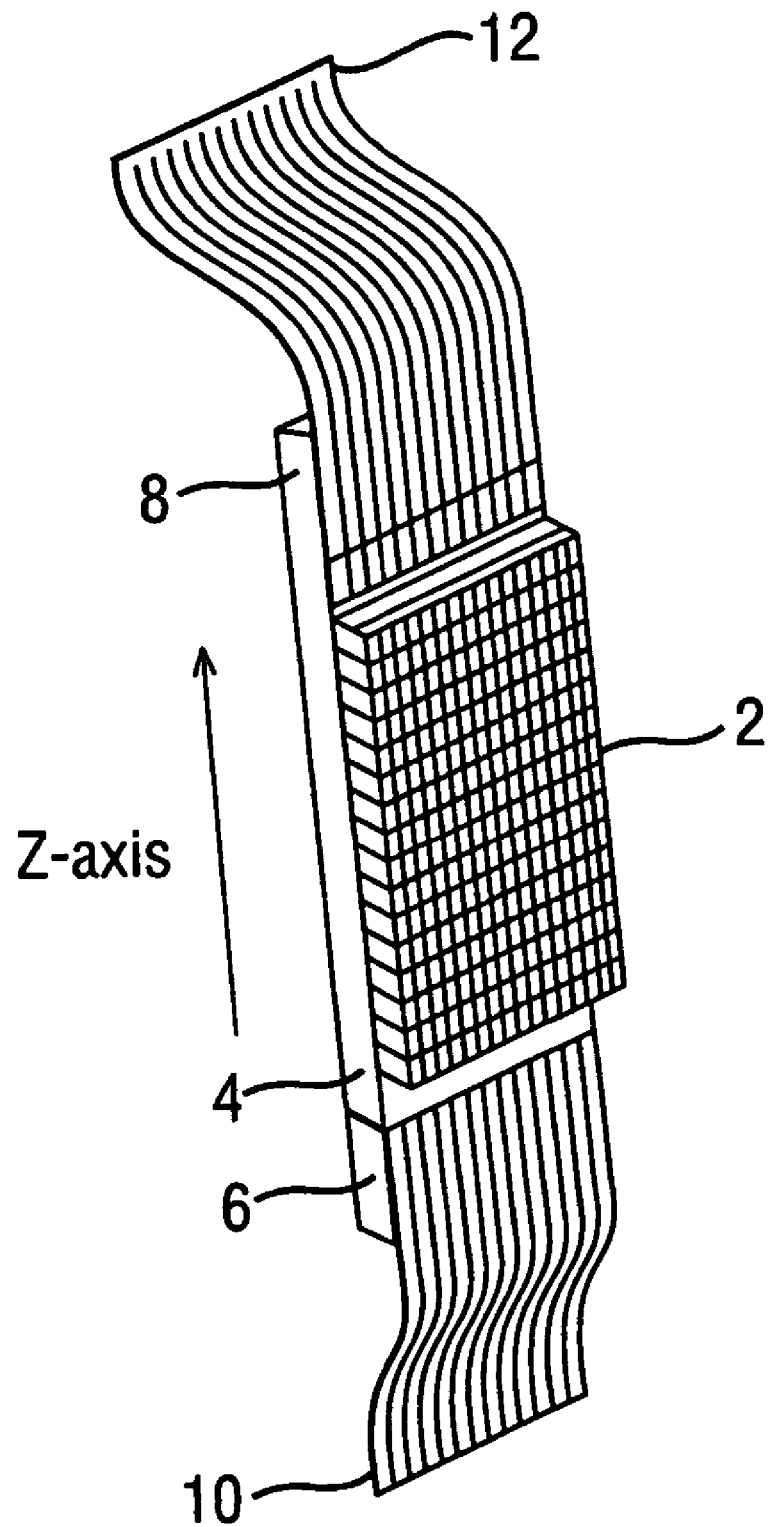
FIG. 1 illustrates the basic construction of a photo-detector array in accordance with one known arrangement.
Figure 2A:
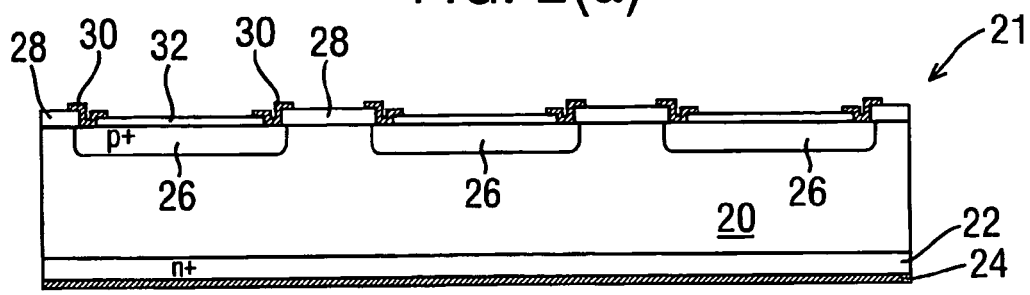
FIG. 2 illustrates a first embodiment for manufacturing a semiconductor packaging structure in accordance with the invention.

Referring to FIG. 2(a) there is illustrated a cross-section of an n-type semiconductor substrate 21 in which a plurality of photo-detector elements is formed. The main n-type bulk substrate is identified by reference numeral 20. A plurality of p+ type wells 26 are formed in the upper surface of the substrate forming active areas of a plurality of photo-diodes. The active areas 26 define the anodes of the photo-diodes. Additional p+ type wells forming guard rings may be associated with each active area 26, but are not shown in the Figures for the sake of clarity of the drawings. Optical windows 32 are formed on the surface of the substrate over the active regions 26. Aluminium contacts 30 are provided on the surface of the substrate to contact the active regions 26. The two aluminium contacts 30 as shown in FIG. 2(a) for each active region 26 represent one, two or several independent contacts from aluminium metallisation areas to the p+ type well. The independent aluminium metallisation areas of each active region 26 may be connected through the p+ type well or the aluminium metallisation areas may be connected in a dimension not presented by the cross-section of FIG. 2(a). For example, the aluminium metallisation may be manufactured as a ring shaped metal line surrounding each active region 26. A field oxide (FOX) layer 28 covers the remainder of the upper surface of the substrate. A continuous n+ implant layer 22 is formed on the under surface of the substrate, to form a cathode of the photo-diodes. A continuous layer of aluminium 24 further covers the underside of the substrate and the n+ layer 22.

The structure of FIG. 2(a) is fabricated using the key process steps for manufacturing high quality diodes on silicon. Such standard techniques are known generally in the art, and especially in the art of fabricating photo-diodes for CT imaging applications, and are therefore not described herein. Process steps to achieve the structure shown in FIG. 2(a) are well-known.

The structure in FIG. 2(a) is a conventional structure formed in the prior art in the process of manufacturing a photo-detector array. In such conventional structures, each of the plurality of active areas 26, forming the anodes, are electrically isolated. The continuous n+ layer 22 constitutes a common cathode for all the photo-detectors.

In accordance with embodiments of the present invention, there is formed a photo-detector array in which the cathodes are electrically isolated, and the anodes are connected to form a common anode. The advantages of such a structure in imaging equipment in particular will be discussed in further details herein below.

Figure 2B:
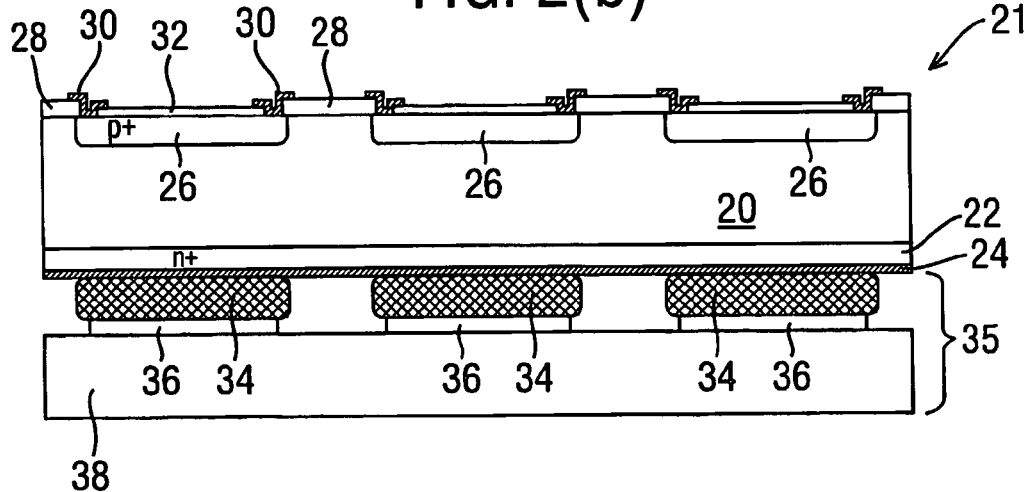

After the fabrication of the structure illustrated in FIG. 2(a), as shown in FIG. 2(b) in accordance with a first embodiment of the present invention a further substrate or integrated circuit, generally designated by reference numeral 38, is provided with a plurality of metallisation areas 36 on one surface, and a corresponding plurality of conductive epoxy areas 34 on the metallisation areas 36. The conductive epoxy areas 34 and the metallisation areas 36 are formed on the substrate of integrated circuit 38 such that they are generally aligned with the active areas 26 in the substrate 21.

The substrate or integrated circuit 38, the metallisation areas 36 and the conductive epoxy areas 34 may be generally considered as a connecting structure or connector interface 35 for the semiconductor device 21.

As can be seen from FIG. 2(b), the semiconductor device 21 is placed over the connecting structure 35 such that the continuous aluminium layer 24 contacting the cathode is in contact with the top surfaces of the plurality of conductive epoxy areas 34. As such, each conductive epoxy area 34 is located underneath the semiconductor 21 in general alignment with an active area 26. The metallisation areas 36 serve to connect the conductive epoxy to the substrate or integrated circuit 38.

The substrate or integrated circuit 38 is for reading out signals from the photo-detector array, and may be provided with a series of signal lines connected to each of the metallisation areas 36. One signal line will be associated with each metallisation area 36, corresponding to the number of photo-detectors in the array.

Figure 2C:
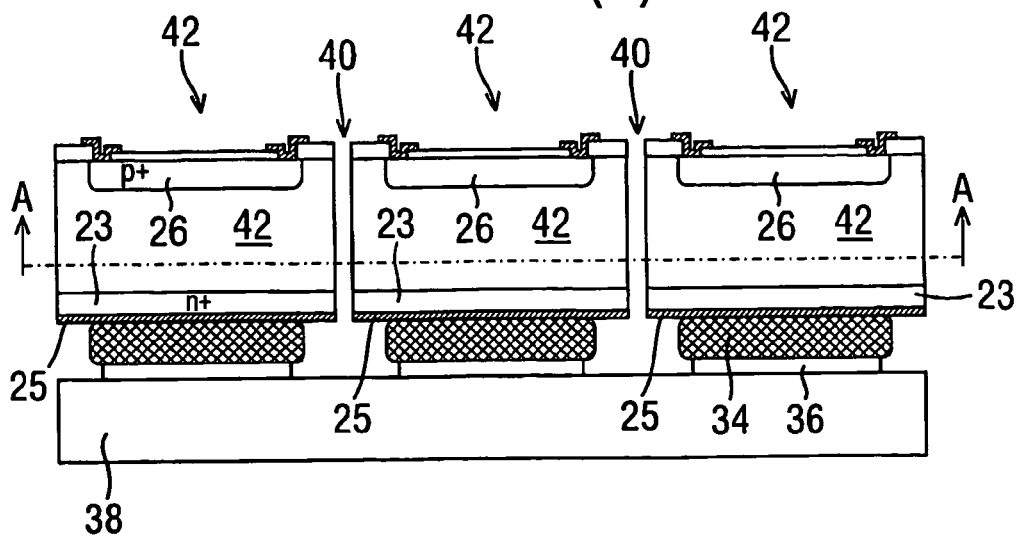
Figure 2D:
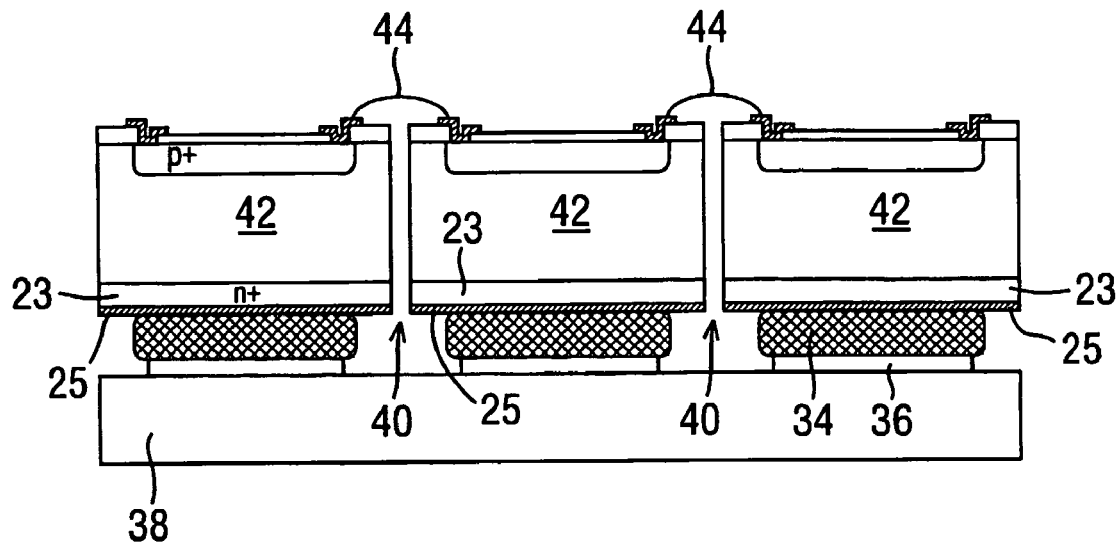
Figure 2E:
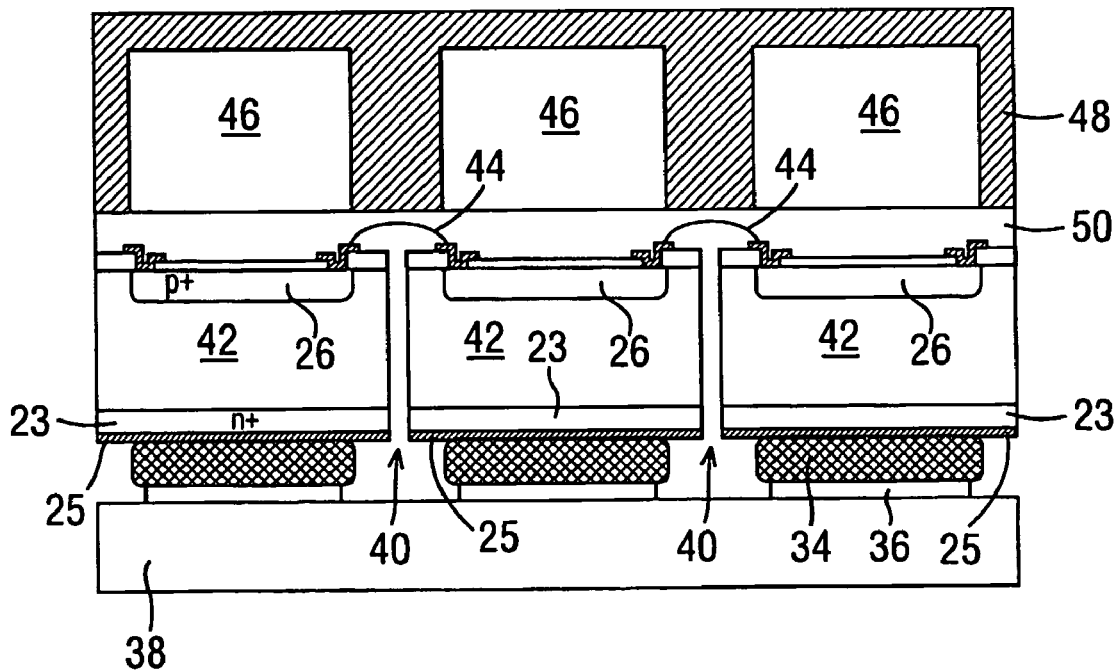
Figure 3A:
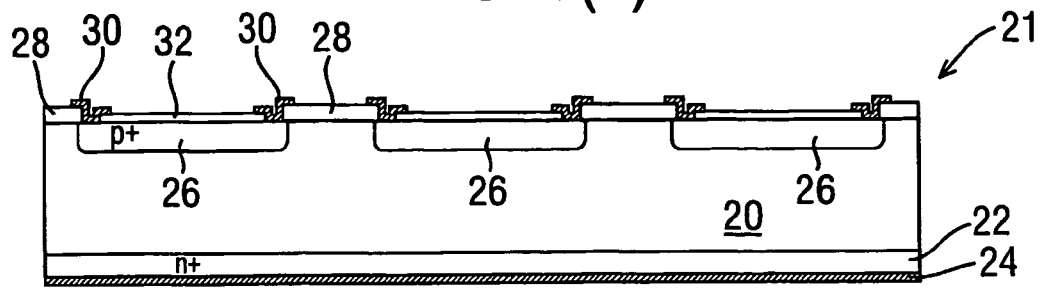
FIG. 3 illustrates a second embodiment for manufacturing a semiconductor packaging structure in accordance with the invention.
Figure 3B:
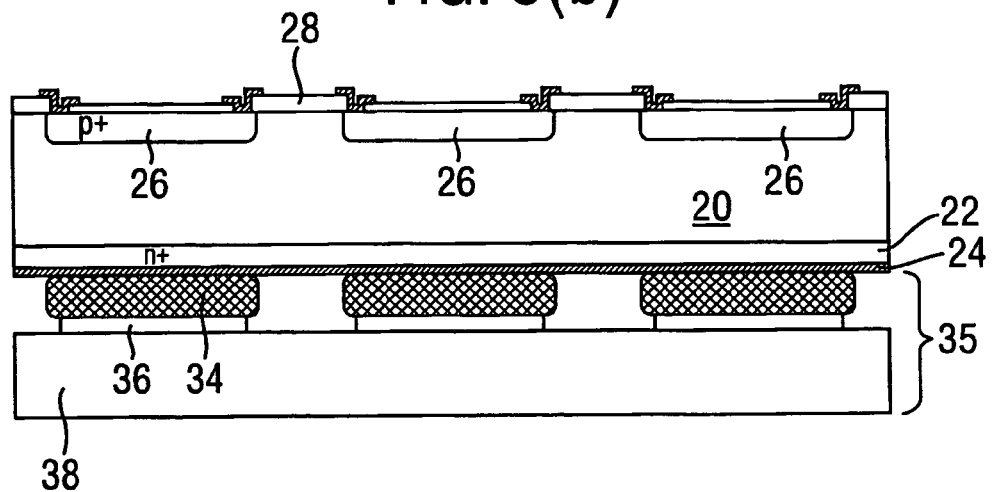
Figure 3C:
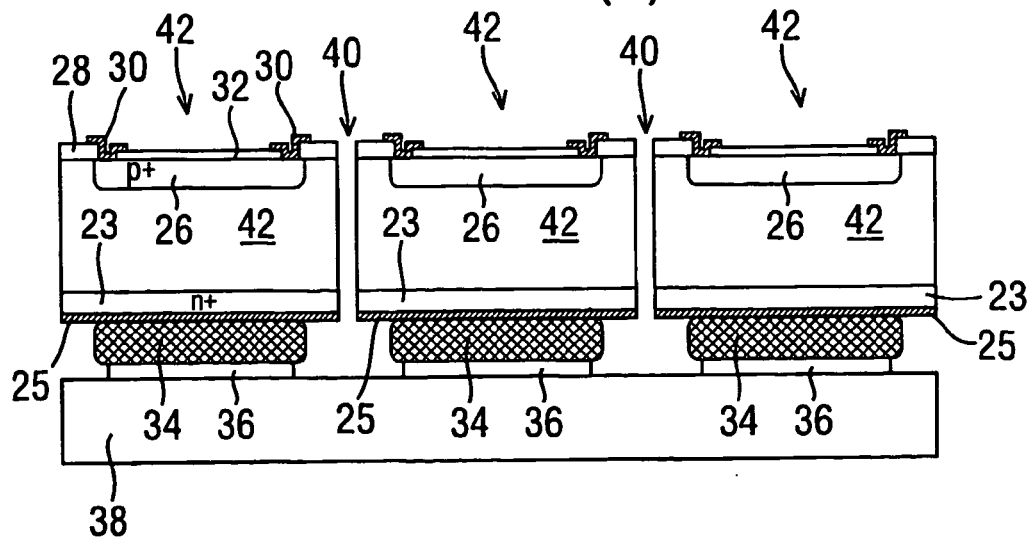
Figure 3D:
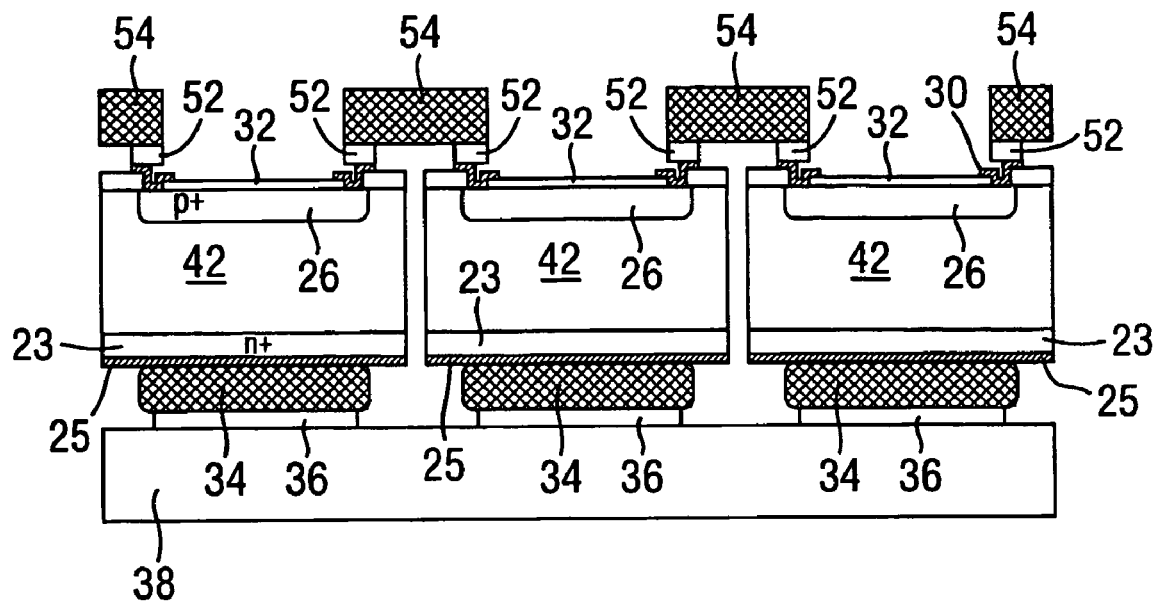
Figure 3E:
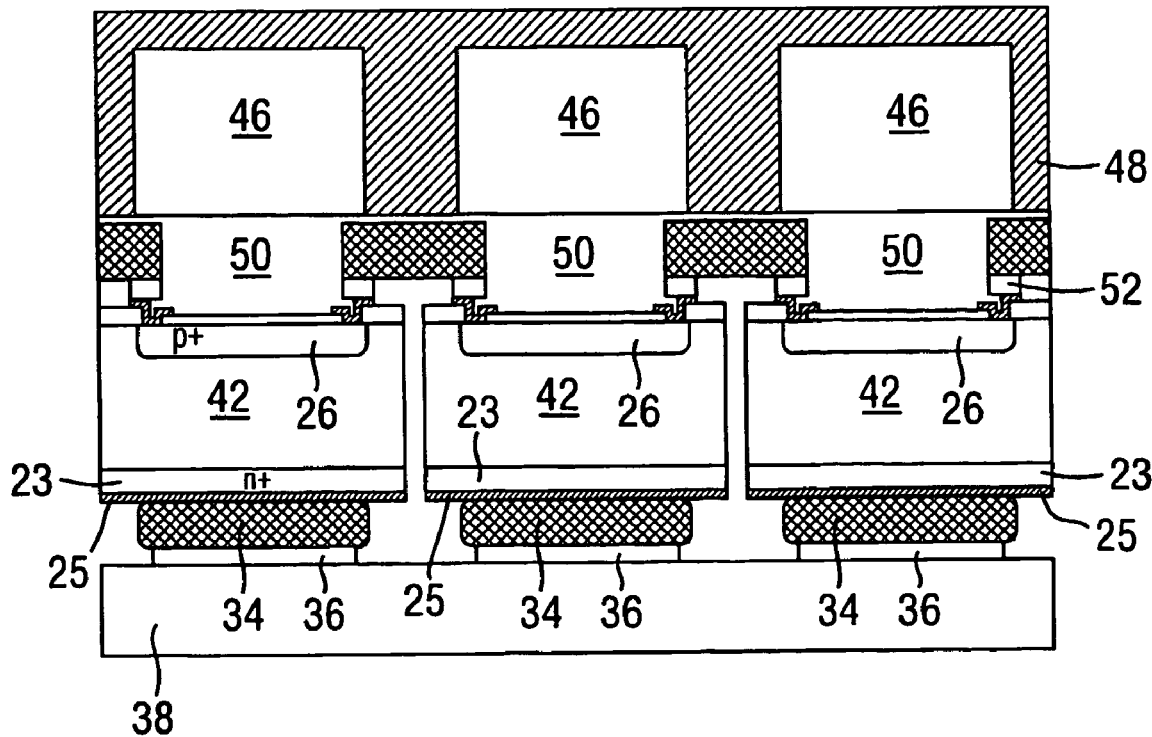

As shown in FIG. 2(c), in a further step a cut or an etch is performed through the field oxide regions 28, the substrate 20, the n+ region 22 and the aluminium layer 24, in order to create a plurality of openings 40 completely through the substrate 20, such that there is created a plurality of semiconductor active regions, each identified by reference numeral 42. Each semiconductor active region 42 comprises a single photo-detector device. As a consequence of the openings 40, each photo-detector device now has a respective individual cathode, comprised of an individual n+ type area 23 on the underside of the substrate region 42. Each individual cathode 23 has a respective portion of aluminium 25 formed on the underside thereof; The individual n+areas 23 forming the cathode areas are formed by the cut or etch through the continuous n+ layer 22 previously formed, and similarly the portions of aluminium 25 are formed by the cut or etch through the continuous aluminium layer 24 previously formed. The anodes (active areas 26) are unchanged after the cut or etch step, remaining electrically isolated.

The cutting or etching steps required to create the openings 40 through the semiconductor device 21 will be well-known to one skilled in the art.

The aluminium layers 25 of the respective cathodes areas 23 are connected to ones of the metallisation layers 36 by the plurality of conductive epoxy layers 34. As the metallisation areas 36 are each associated with a signal line to read out signals from the semiconductor array, then all the individual cathodes now formed are provided with connections off-chip through the connecting structure 35.

As shown in FIG. 2(*d*), in a following step all the anodes 26 in each semiconductor active region 42 are connected together. In this embodiment, this is achieved by providing a bonding wire connection 44 between the aluminium contacts 30 of each anode active area 26. Thus the anodes of each photo-detector device are connected together, to form a single anode.

Finally, as shown in FIG. 2(*e*), the fabrication of the semiconductor packaging structure is completed by forming a layer 50 of optically transparent material over the surface of the entire substrate resulting from step 2(*d*), and then forming a structure comprising a plurality of scintillator materials 46 associated with each anode, and a reflector material 48 surrounding the top and sides of such. The formation of the structure shown in FIG. 2(*e*) will be well-known to one skilled in the art.

Thus, a semiconductor packaging structure is formed in which all connections for reading out signals from the photo-detectors, in this case photo-diodes, are provided on the under-surface of the semiconductor substrate, now divided into a plurality of semiconductor active regions comprising single photo-detector devices. Thus all electrical connections for the photodiodes are provided, in accordance with the present invention, on the undersides of the active regions, for connections off-chip. The electrical connections may be taken further off-chip by electrical signal lines on the substrate or integrated circuit 38. Substrate 38 may comprise electrical signal lines on its under-surface, several conductor and electrically isolating layers, vias and other structures as is familiar to one skilled in the art. Alternatively the substrate 38 may simply provide a means for off-chip connections via connectors or pads on its under-surface.

It should be noted that whilst in this and other embodiments described herein the cathodes are contacted to the substrate or integrated circuit 38 using the epoxy layers 34, other techniques for connecting the cathodes off-chip may be used. For example, there may be provided wire bonding to the cathode metal (aluminium layers 25) or bump bonding between the aluminium layer 25 and metallisation area 36. One skilled in the art will appreciate various wiring methods for making off-chip connections for the plurality of cathodes from the underside of the substrate.

In the embodiments described herein, there is described an etching of the substrate to form individual photo-detectors—in FIG. 2 the substrate 20 is divided into a plurality of smaller substrates 42 in each of which there is formed a photo-detector device. However the separation of the semiconductor substrate is not limited to the etching process described herein, a mechanical method or chemical etching may separate the substrate into smaller chips. The separation may utilize, in addition to etching, (e.g. inductively coupled plasma etching), a sawing principle (e.g. a wafer dicing saw) or a machining principle. A further process for fabricating a semiconductor packaging structure in accordance with a second embodiment of the present invention is now described with reference to FIG. 3. In FIG. 3 reference numerals that correspond to reference numerals used in earlier Figures refer to like features.

As in the embodiment of FIG. 2, the starting point for the fabrications is a structure as shown in FIG. 3(*a*) which corresponds identically to the structure shown in FIG. 2(*a*). In accordance with this embodiment of the invention, the structure is first prepared in the same manner as in FIG. 2, to form a structure in which each individual photo-detector in the array is formed as a single or separate semiconductor device 42. Thus FIGS. 3(*b*) and 3(*c*) correspond identically to FIGS. 2(*b*) and 2(*c*).

After the structure in FIG. 3(*c*) is formed, as described hereinabove with reference to FIGS. 2(*a*) to 2(*c*), as shown in FIG. 3(*d*) the anodes of each photo-detector are connected together. In this embodiment, a conductive epoxy layer 52 is first formed on at least one aluminium contact 30 of each active area 26. In FIG. 3(*d*) a conductive epoxy layer 52 is shown on both of the two illustrated aluminium contacts 30 of each active area 26, Thereafter, a connective sheet or layer of material 54 is formed or placed over the surface of the device, forming a conductive connection between the active areas 26, and thus forming a single common anode for all devices. The conductive sheet or layer of conductive material 54 is patterned to allow for contracts to the device active regions to be subsequently formed. The conductive sheet or layer of conductive material 54 may be pre-patterned before deposition, or may be patterned after deposition of a conductive layer. The connective sheet may also comprise a conductive layer of material deposited on the under-surface of an isolating material such as aluminium oxide.

Finally, as shown in FIG. 3(*e*), the fabrication of the semiconductor packaging structure is completed by forming a layer 50 of optically transparent material over the surface of the entire substrate resulting from step 3(*d*), and then forming a structure comprising a plurality of scintillator materials 46 associated with each anode, and a reflector material 48 surrounding the top and sides of such. The formation of the structure shown in FIG. 3(*e*) will be well-known to one skilled in the art. The formation of the structure shown in FIG. 3(*e*) is identical to that described hereinabove with reference to FIG. 2(*e*).

A further process for fabricating a semiconductor packaging structure in accordance with a third embodiment of the present invention is now described with reference to FIG. 4. In FIG. 4 reference numerals that correspond to reference numerals used in earlier Figures refer to like features.

As in FIG. 2, the process is described from the starting point of a known structure, as shown in FIG. 4(*a*), which structure corresponds to the structure of FIG. 2(*a*).

Thereafter, as shown in FIG. 4(*b*), the anodes of each photo-detector are connected together. In this embodiment, a conductive epoxy layer 52 is first formed on at least one aluminium contact 30 of each active area 26. In FIG. 4(*b*) a conductive epoxy layer 52 is shown on both of the two illustrated aluminium contacts 30 of each active area 26. Thereafter, a connective sheet or layer of material 54 is formed or placed over the surface of the device, forming a conductive connection between the active areas 26, and thus forming a single common anode for all devices. This is equivalent to the step shown in FIG. 3(*d*).

As shown in FIG. 4(*c*) the fabrication of the semiconductor packaging structure is continued by forming a layer 50 of optically transparent material over the surface of the entire substrate resulting from step 4(*b*), and then forming a structure comprising a plurality of scintillator materials 46 associated with each anode, and a reflector material 48 surrounding the top and sides of such. The manufacturing step presented in FIG. 4(*c*) is identical to that described hereinabove with reference to FIG. 2(*e*).

Figure 4A:
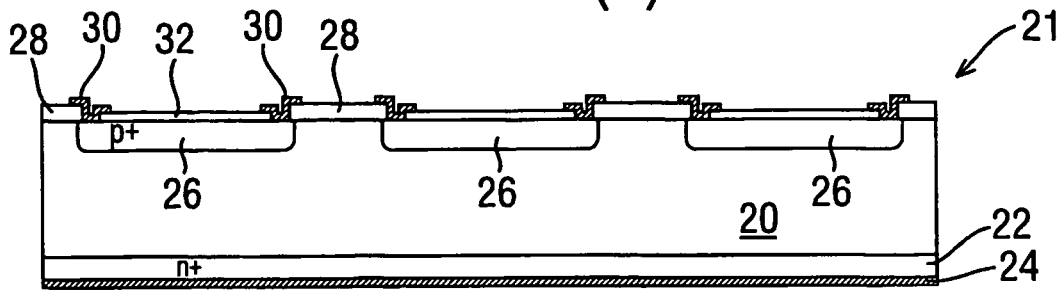
FIG. 4 illustrates a third embodiment for manufacturing a semiconductor packaging structure in accordance with the invention.
Figure 4B:
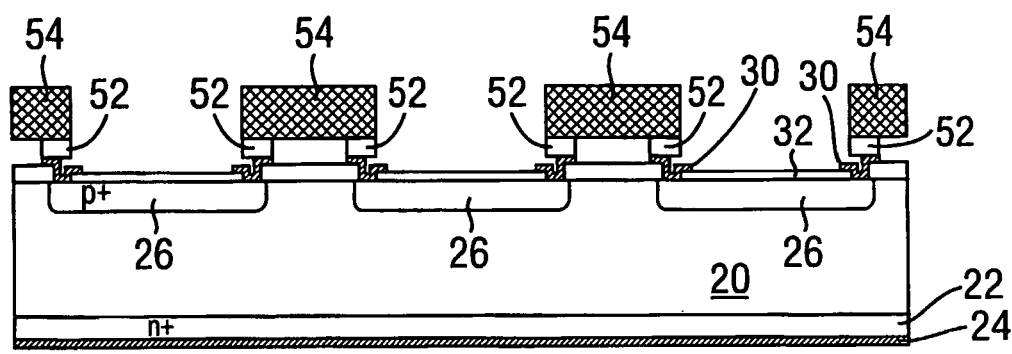
Figure 4C:
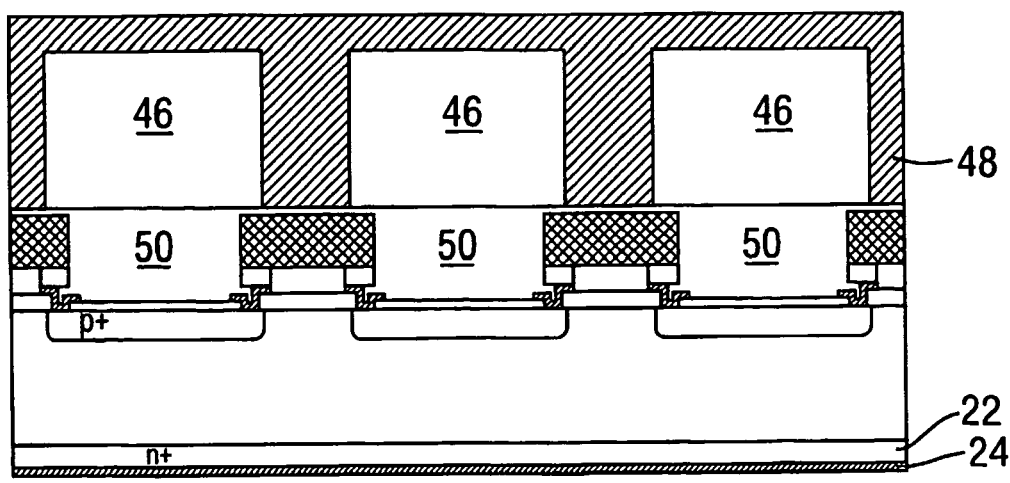
Figure 4D:
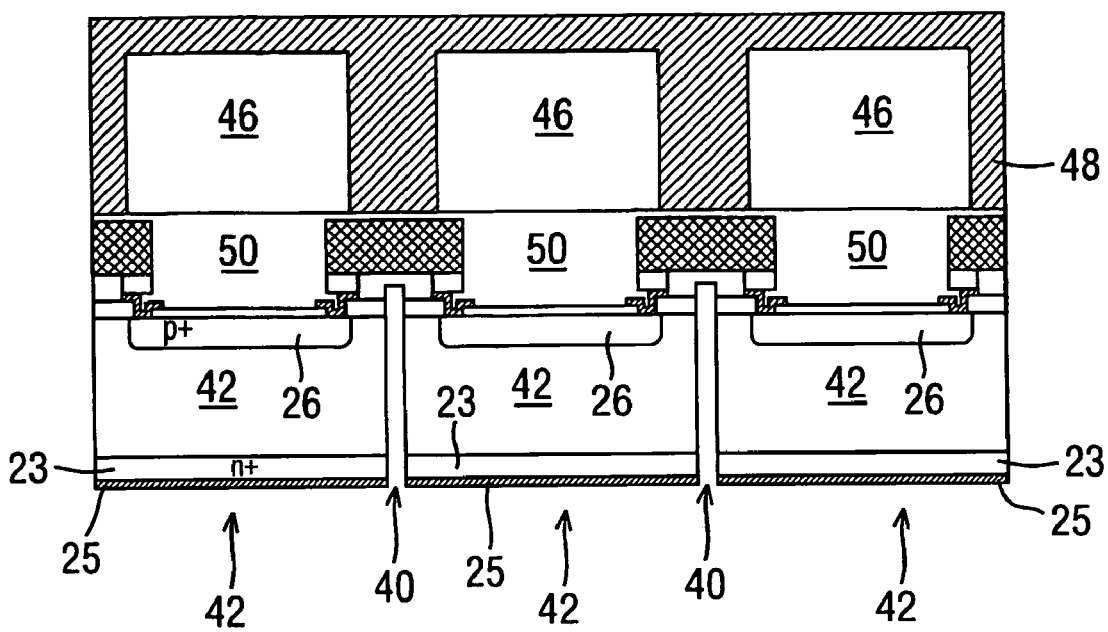

As shown in FIG. 4(d), in a further step a cut or an etch is then performed through the aluminium layer 24, the n+ region 22, the semiconductor substrate 20, the field oxide regions 28 and partly through the optically transparent material 50, in order to create a plurality of openings 40 completely through the substrate, such that there is created a plurality of semiconductor active regions, each identified by reference numeral 42. Each semiconductor active region 42 comprises a single photo-detector device. As a consequence of the openings 40, each photo-detector device now has a respective individual cathode, comprised of an individual n+ type area 23 on the underside of the substrate region 42. Each individual cathode 23 has a respective portion of aluminium 25 formed on the underside thereof. The individual n+ areas 23 forming the cathode areas are formed by the cut or etch through the continuous n+ layer 22 previously formed, and similarly the portions of aluminium 25 are formed by the cut or etch through the continuous aluminium layer 24 previously formed. The anodes (active areas 26) remain electrically isolated. This is equivalent to the step shown in FIG. 2(c), although in step 4(d) the cut or etch is performed through from the underside of the device rather than from the top surface of the device. However, one skilled in the art will appreciate that performing the cut or etch step from below or above the substrate 20 does not create a significantly different structure, especially in the embodiment shown where the etch or cut goes completely through the substrate.

Figure 4E:
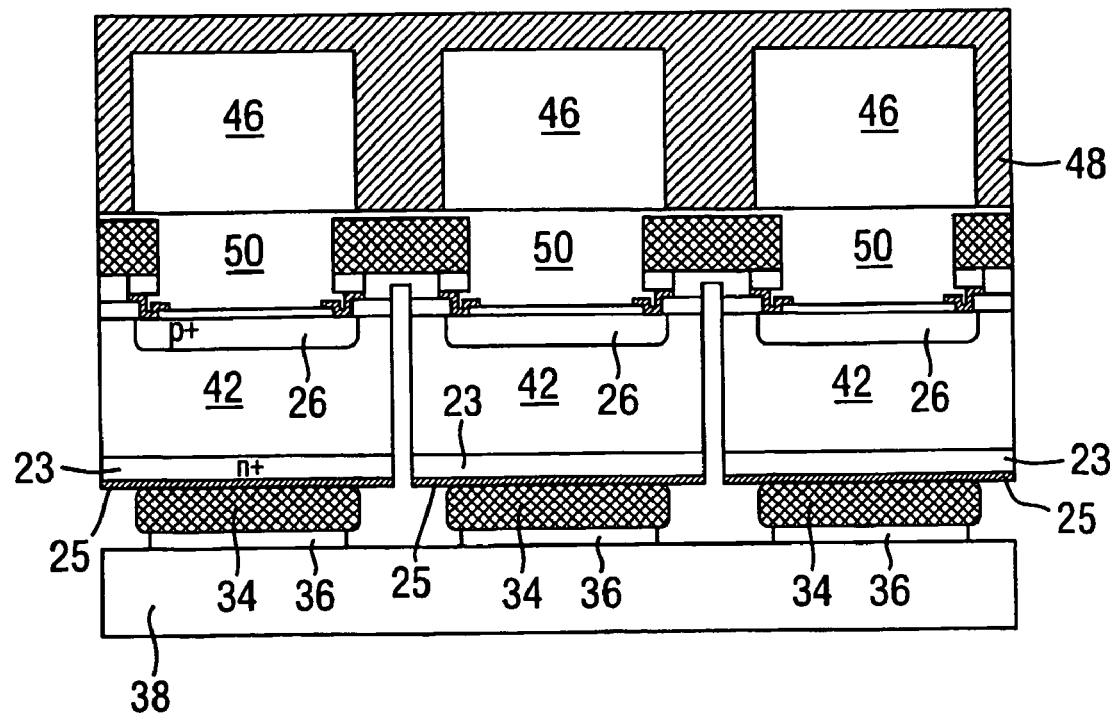

As shown in FIG. 4(e) the structure is finalized in accordance with this embodiment of the invention by providing a further substrate or integrated circuit, generally designated by reference numeral 38, with a plurality of metallisation areas 36 on one surface, and a corresponding plurality of conductive epoxy areas 34. The conductive epoxy areas 34 and the metallisation areas 36 are formed on the substrate or integrated circuit 38 such that they are generally aligned with the active areas 26 in the substrate 21. As can be seen from FIG. 4(e), the semiconductor device 21, now divided into a plurality of semiconductor active regions 42 comprising single photo-detector devices, is placed over the connecting structure 35 such that the aluminium layers 25 contacting the individual cathodes 23 of the active regions 42 are in contact with the top surfaces of the plurality of conductive epoxy areas 34. As such, each conductive epoxy area 34 is located underneath the semiconductor device 21 in general alignment with an active area 26. The metallisation areas 36 serve to connect the conductive epoxy to the substrate or integrated circuit 38.

A further process for fabricating a semiconductor packaging structure in accordance with a fourth embodiment of the present invention is now described with reference to FIG. 5. In FIG. 5 reference numerals that correspond to reference numerals used in earlier Figures refer to like features.

Figure 5A:
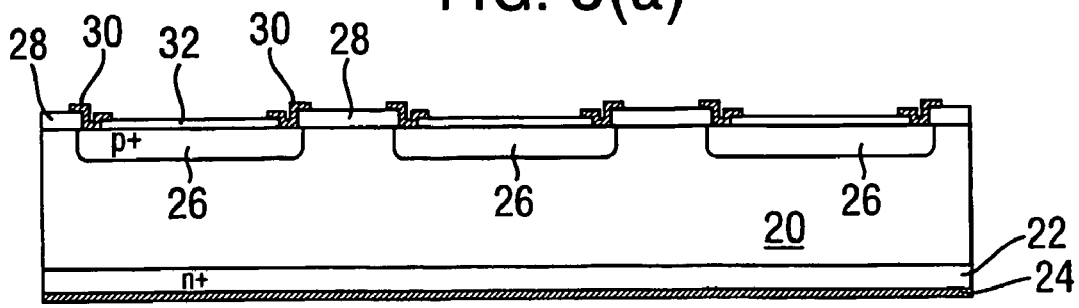
FIG. 5 illustrates a fourth embodiment for manufacturing a semiconductor packaging structure in accordance with the invention.

As in FIG. 2, the process is described from the starting point of a known structure, as shown in FIG. 5(a), which structure corresponds to the structure of FIG. 2(a).

Figure 5B:
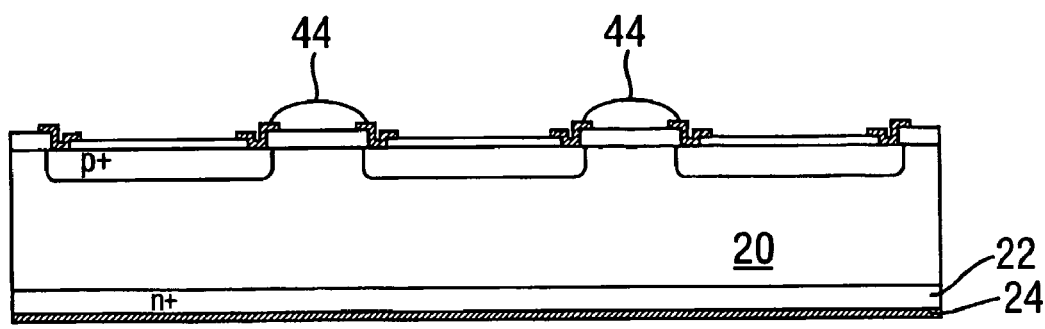

As shown in FIG. 5(b) the anodes of each photo-detector are connected together. In this embodiment, this is achieved by providing a bonding wire connection 44 between the aluminium contacts 30 of each anode active area 26. Thus the anodes of each photo-detector device are connected together, to form a single common anode contact. This manufacturing step is equivalent to the step shown in FIG. 2(d) although in step 2(d) the semiconductor device 21 has already been cut or etched to create a plurality of openings 40 through the device.

Figure 5C:
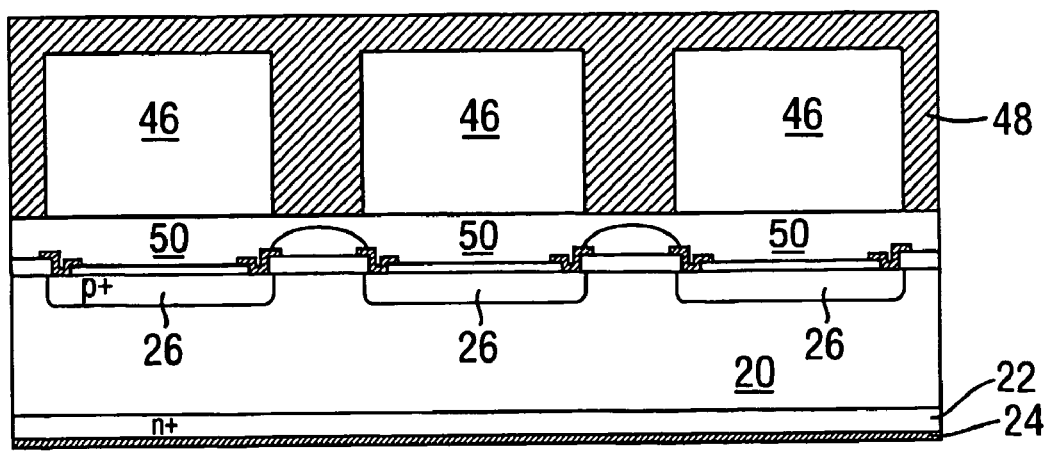

As shown in FIG. 5(c) the fabrication of the semiconductor packaging structure is continued by forming a layer 50 of optically transparent material over the surface of the substrate resulting from step 5(b), and then forming a structure comprising a plurality of scintillator materials 46 associated with each anode, and a reflector material 48 surrounding the top and sides of such. The manufacturing step presented in FIG. 5(c) is identical to that described hereinabove with reference to FIG. 2(e) although in step 2(e) the semiconductor device 21 has already been cut or etched to create a plurality of openings 40 through the device.

Figure 5D:
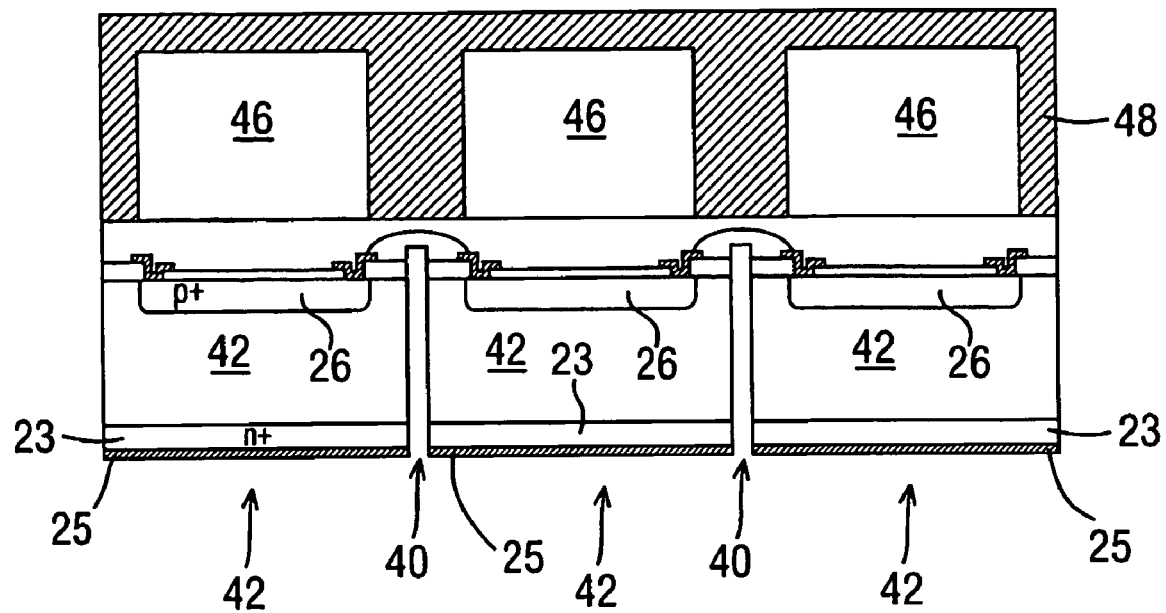

As shown in FIG. 5(d), in a further step a cut or an etch is then performed through the aluminium layer 24, the n+ region 22, the semiconductor substrate 20, the field oxide regions 28 and partly through the optically transparent material 50, in order to create a plurality of openings 40 completely through the substrate, such that there is created a plurality of semiconductor active regions, each identified by reference numeral 42. Each semiconductor active region 42 comprises a single photo-detector device.

As a consequence of the openings 40, each photo-detector device now has a respective individual cathode, comprised of an individual n+ type area 23 on the underside of the substrate region 42. Each individual cathode 23 has a respective portion of aluminium 25 formed on the underside thereof. The individual n+ areas 23 forming the cathode areas are formed by the cut or etch through the continuous n+ layer 22 previously formed, and similarly the portions of aluminium 25 are formed by the cut or etch through the continuous aluminium layer 24 previously formed. The anodes (active areas 26) remain electrically isolated. This is equivalent to the step shown in FIG. 2(c), although in step 5(d) the cut or etch is performed through from the underside of the device rather than from the top surface of the device.

Figure 5E:
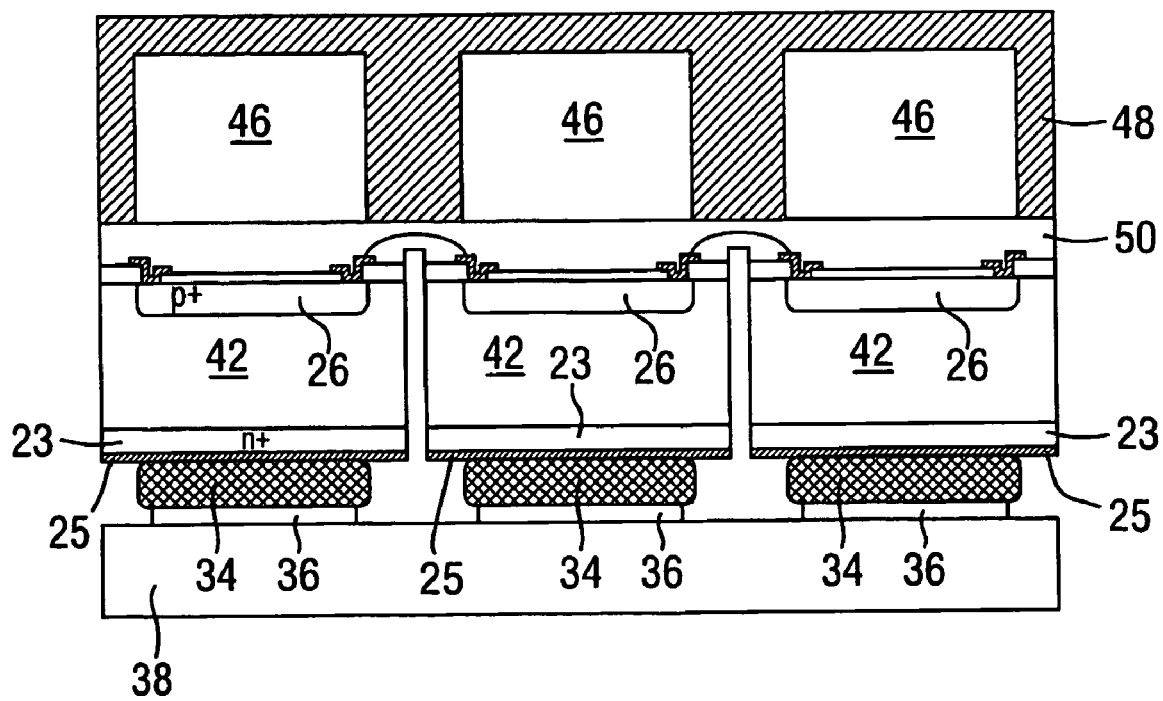

As shown in FIG. 5(e) the structure is finalized in accordance with this embodiment of the invention by providing a further substrate or integrated circuit, generally designated by reference numeral 38, with a plurality of metallisation areas 36 on one surface, and a corresponding plurality of conductive epoxy areas 34. The conductive epoxy areas 34 and the metallisation areas 36 are formed on the substrate or integrated circuit 38 such that they are generally aligned with the active areas 26 in the substrate 21. As can be seen from FIG. 5(e), the semiconductor device 21, now divided into a plurality of semiconductor active regions 42 comprising single photo-detector devices, is placed over the connecting structure 35 such that the aluminium layers 25 contacting the individual cathodes of the active regions 42 are in contact with the top surfaces of the plurality of conductive epoxy areas 34. As such, each conductive epoxy area 34 is located underneath the semiconductor device 21 in general alignment with an active area 26. The metallisation areas 36 serve to connect the conductive epoxy to the substrate or integrated circuit 38.

A further process for fabricating a semiconductor packaging structure in accordance with a fifth embodiment of the present invention is now described with reference to FIG. 6. In FIG. 6 reference numerals that correspond to reference numerals used in earlier Figures refer to like features.

Figure 6A:
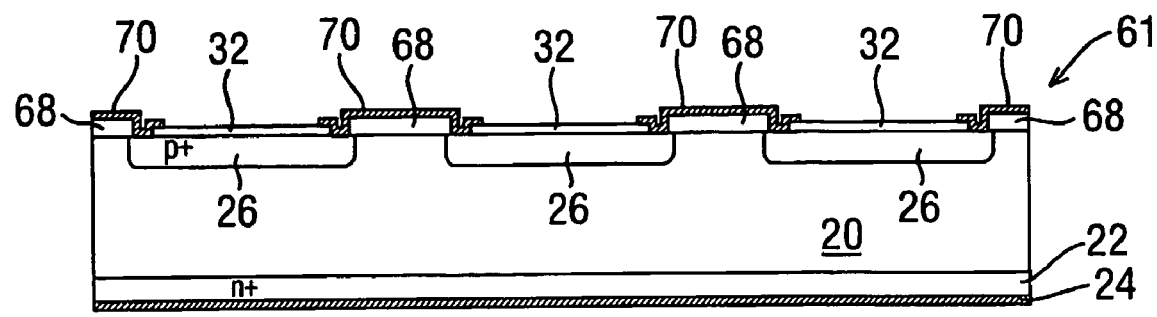
FIG. 6 illustrates a fifth embodiment for manufacturing a semiconductor packaging structure in accordance with the invention.
Figure 6B:
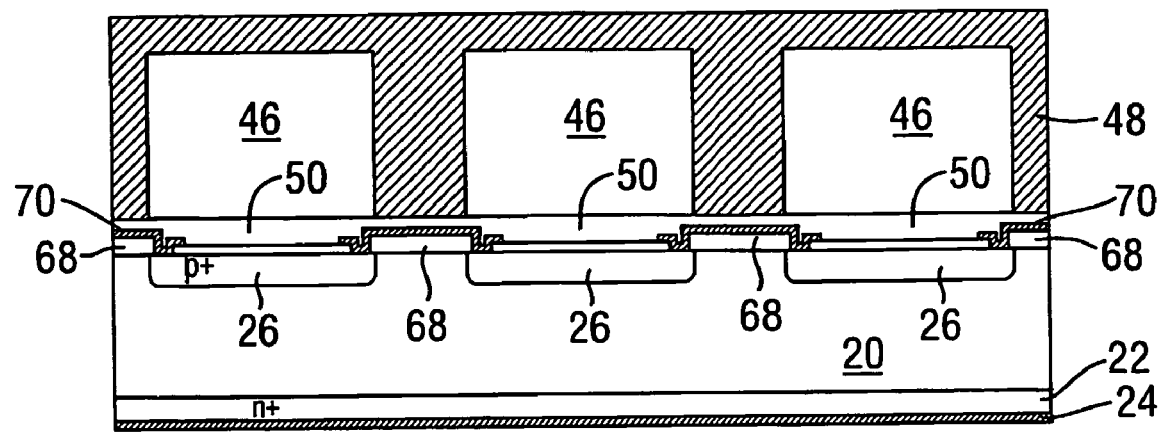
Figure 6C:
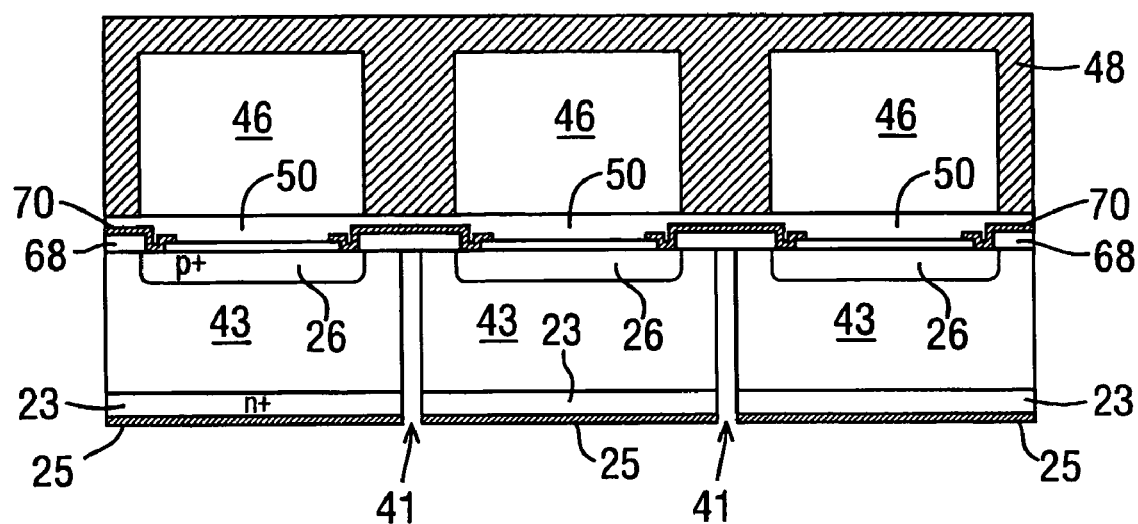
Figure 6D:
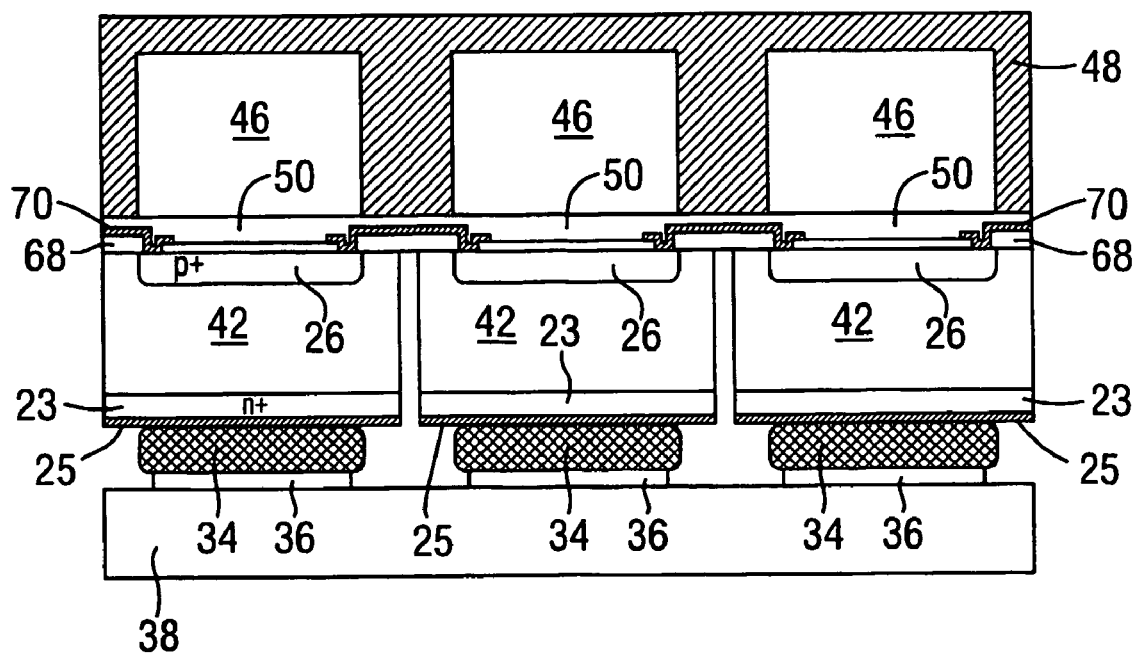

Referring to FIG. 6(a) there is illustrated a cross-section of an n-type semiconductor substrate 61 in which a plurality of photo-detector elements is formed. The main n-type bulk substrate is identified by reference numeral 20. A plurality of p+ type wells 26 are formed in the upper surface of the substrate forming active areas of a plurality of photo-diodes. The active areas 26 define the anodes of the photo-diodes. Additional p+ type wells forming guard rings may be associated with each active area 26, but are not shown in FIG. 6 for the sake of clarity of the drawings. Optical windows 32 are formed on the surface of the substrate over the active regions 26.

A passivation layer 68 covers the remainder of the upper surface of the substrate (outside the optical windows). The passivation layer may consist of a multilayer structure of thermal silicon dioxide, LTO (low temperature oxide), silicon nitride or other similar passivation material well known to one skilled in the art of semiconductor processing. This passivation layer 68 replaces the field oxide layer 28 shown in FIGS. 2 to 5.

Contact and interconnection metallisation 70 is further provided on the surface of the substrate to contact the active regions 26 and to provide a common connection between the anodes. The metallisation layer 70 may consist of several metal layers manufactured on each other. The two metallisation contacts from metallisation 70 to the p+ wells 26 as shown in FIG. 6(*a*) for each active region 26 represent one, two or several independent contacts from the metallisation to the p+ type well. The independent metallisation areas of each active region 26 and metallisation shown between the independent active regions 26 in FIG. 6(*a*) may be connected through the p+ type well or the metallisation areas may be connected in a dimension not presented by the cross-section of FIG. 6(*a*). For example, the metallisation may be manufactured as a ring shaped metal line surrounding each active region 26 in addition to what is presented in FIG. 6(*a*).

The passivation layer 68 is used in FIG. 6 in place of the field oxide layers 28 in the embodiments of FIGS. 2 to 5, in order to provide a thicker layer on which the metallisation layers 70 may be formed.

A continuous n+ implant layer 22 is formed on the under surface of the substrate, to form a cathode of the photo-diodes. A continuous metallisation layer 24 further covers the underside of the substrate and the n+ layer 22. Therefore, contrary to the embodiments presented in FIGS. 2 to 5, in this embodiment the metallisation 70 connecting to the active areas 26 of the photo-detector devices is formed in such a way that at least some of the metal contacts provide a common connection between the anodes. As such, the metal contacts 70 are used to interconnect the anodes of the array to form a single anode. Enough of the aluminium contacts are formed with a common connection to at least two anodes to provide sufficient connections for all anodes to be interconnected.

As shown in FIG. 6(*b*) the fabrication of the semiconductor packaging structure is continued by forming a layer 50 of optically transparent material over the surface of the substrate, and then forming a structure comprising a scintillator material 46 associated with each anode, and a reflector material 48 surrounding the top and sides of such. The formation of the structure shown in FIG. 6(*b*) is similar to that described hereinabove with reference to FIG. 2(*e*) although in step 2(*e*) the semiconductor device 21 has already been cut or etched to create a plurality of openings 40 through the device.

As shown in FIG. 6(*c*), in a further step a cut or an etch is then performed from underneath the substrate 20 through the aluminium layer 24, the n+region 22, and the substrate 20. In this embodiment the cut or etch does not go completely through the semiconductor substrate 61. The passivation layer regions 68 are mainly not effected by the cut or etch and the metallisation layers 70 are unaffected. The passivation layer 68 provides sufficient protection for the metallisation layers 70 against a chemical etching process approaching the metallisation from the underside of the substrate, or provides a reasonable mechanical tolerance requirement for a mechanical cutting or machining method approaching from the same direction.

As such a plurality of openings 41 are formed almost completely through the substrate 61, such that there is created a plurality of semiconductor active regions, each identified by reference numeral 43. Each individual semiconductor active region 43 is connected to at least one neighboring active region by the metallisation layer 70, and at least part of the passivation layer region 68. Each semiconductor active region 43 comprises a single photo-detector device.

As a consequence of the openings 41, each photo-detector device now has a respective individual cathode, comprised of an individual n+ type area 23 on the underside of the substrate region 43. Each individual cathode 23 has a respective portion of aluminium 25 formed on the underside thereof. The individual n+ areas 23 forming the cathode areas are formed by the cut or etch through the continuous n+ layer 22 previously formed, and similarly the portions of aluminium 25 are formed by the cut or etch through the continuous aluminium layer 24 previously formed.

The anodes (active areas 26) remain electrically isolated. This is equivalent to the step shown in FIG. 2(*c*), although in step 6(*c*) the cut or etch is performed through from the underside of the device rather than from the top surface of the device and the cut or etch does not extend completely through the substrate 61.

As shown in FIG. 6(*d*) the structure is finalized in accordance with this embodiment of the invention by providing a further substrate or integrated circuit, generally designated by reference numeral 38, with a plurality of metallisation areas 36 on one surface, and a corresponding plurality of conductive epoxy areas 34. The conductive epoxy areas 34 and the metallisation areas 36 are formed on the substrate or integrated circuit 38 such that they are generally aligned with the active areas 26 in the substrate 61. As can be seen from FIG. 6(*d*), the semiconductor device 61, now divided into a plurality of semiconductor active regions 43 comprising single photo-detector devices, is placed over the connecting structure 35 such that the aluminium layers 25 contacting the individual cathodes of the active regions 43 are in contact with the top surfaces of the plurality of conductive epoxy areas 34. As such, each conductive epoxy area 34 is located underneath the semiconductor device 61 in general alignment with an active area 26. The metallisation areas 36 serve to connect the conductive epoxy to the substrate or integrated circuit 38.

Figure 7:
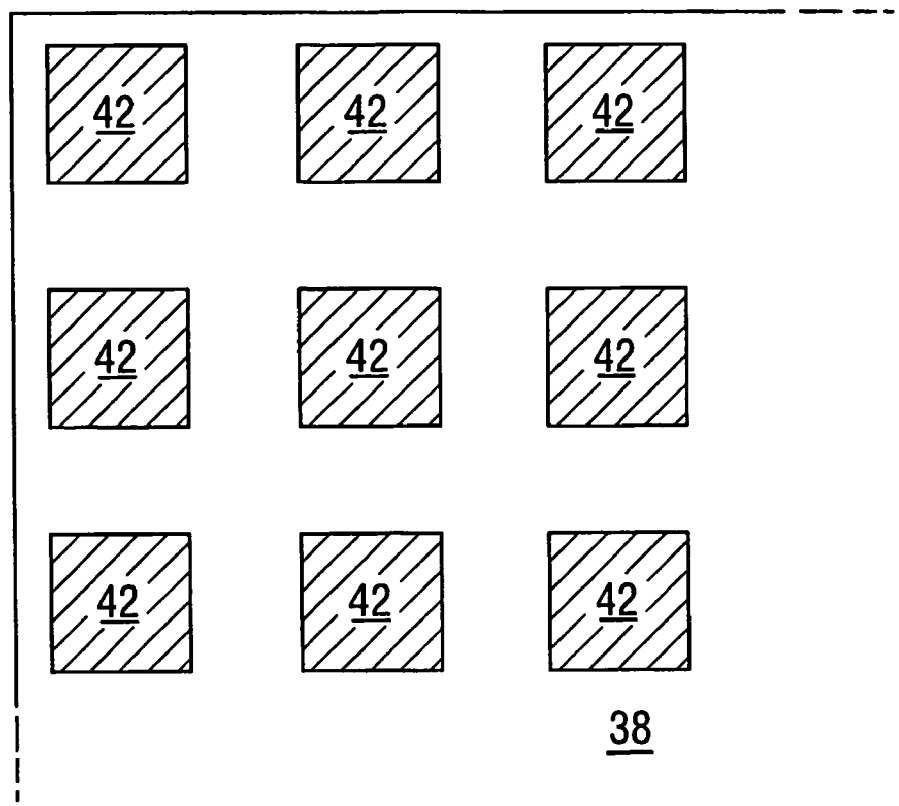
FIG. 7 illustrates a cross-section through the semiconductor substrate in one of the embodiments.

Referring to FIG. 7, there is illustrated a cross-section through the semiconductor device of FIG. 2(*c*), along the line A-A. As can be seen the individual semiconductor devices—or islands—42 are completely isolated by the cutting or etching process. The substrate 38 provides the base upon which the individual semiconductor devices are mounted.

Although the semiconductor devices 42 are shown to be rectangular, the shape is not relevant to the present invention. The cross-sectional shape may be circular.

The present invention thus advantageously provides a technique for constructing a photo detector array which does not require the provision of space at the edge of the array for the connection of the electrical output signals from the array. This advantage is obtained by connecting all signals from the semiconductor devices at the underside of the substrate, such that they can be connected on the underside of the array rather than the side of the array.

It should be noted that the substrate or integrated circuit 38 also preferably provides an off-chip connection for the common anode connection. This is not shown in the Figures, but it will be understood by one skilled in the art how such a connection may be provided, for example by providing a single hole through the substrate 20 for a connection from the surface to the substrate 38. The openings 40 or 41 formed in the substrate 20 may even be used for the anode connection to the substrate 38.

Figure 8:
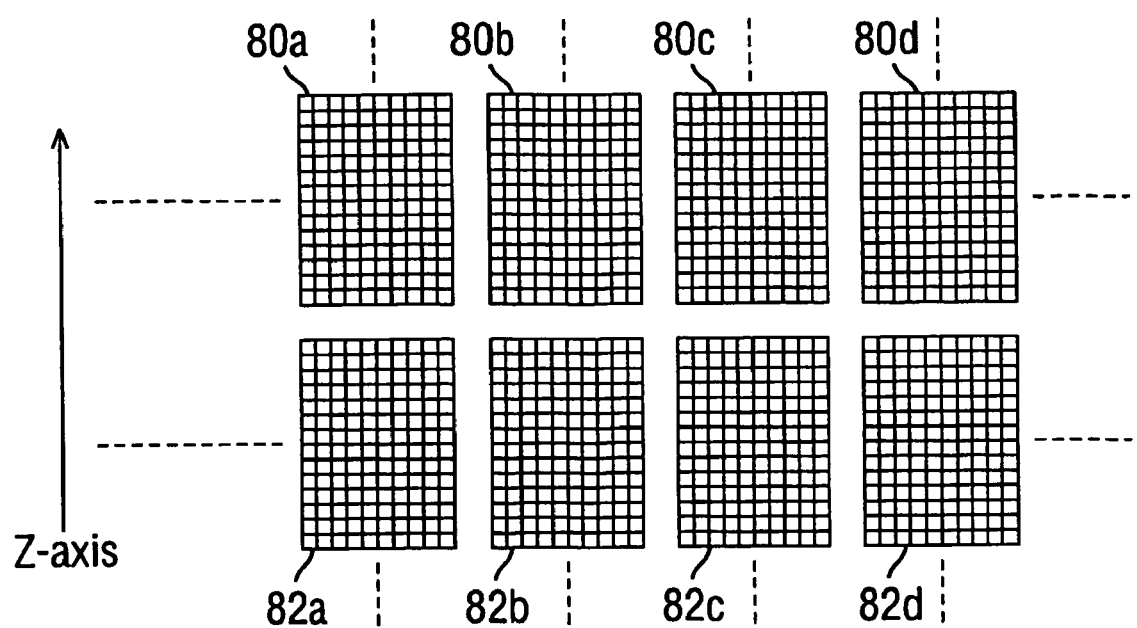
FIG. 8 illustrates the construction of a large photo-detector array in accordance with an advantageous implementation of the present invention.

As a result of the removal of the connections from the edge of the array, previously provided in the z direction, there is provided the possibility to extend the size of the overall photo-detector array in the z-axis. Referring to FIG. 8, a set of photo-detector arrays 80*a* to 80*d* in accordance with the known techniques for assembling arrays is placed together with a further set of arrays 82*a* to 82*d*, such that the overall array is extended in the z-axis. As will be appreciated, the array may be further extended in the z-axis. Although the arrays in FIG. 8 are shown slightly spaced apart, this is only to illustrate the fact that separate arrays are joined in two dimensions. In practice the arrays are in close proximity to each other in both directions, so as to combine to make a larger array. As such, a tiled structure of arrays can be built in two dimensions, to improve the performance of imaging systems.

Figure 9:
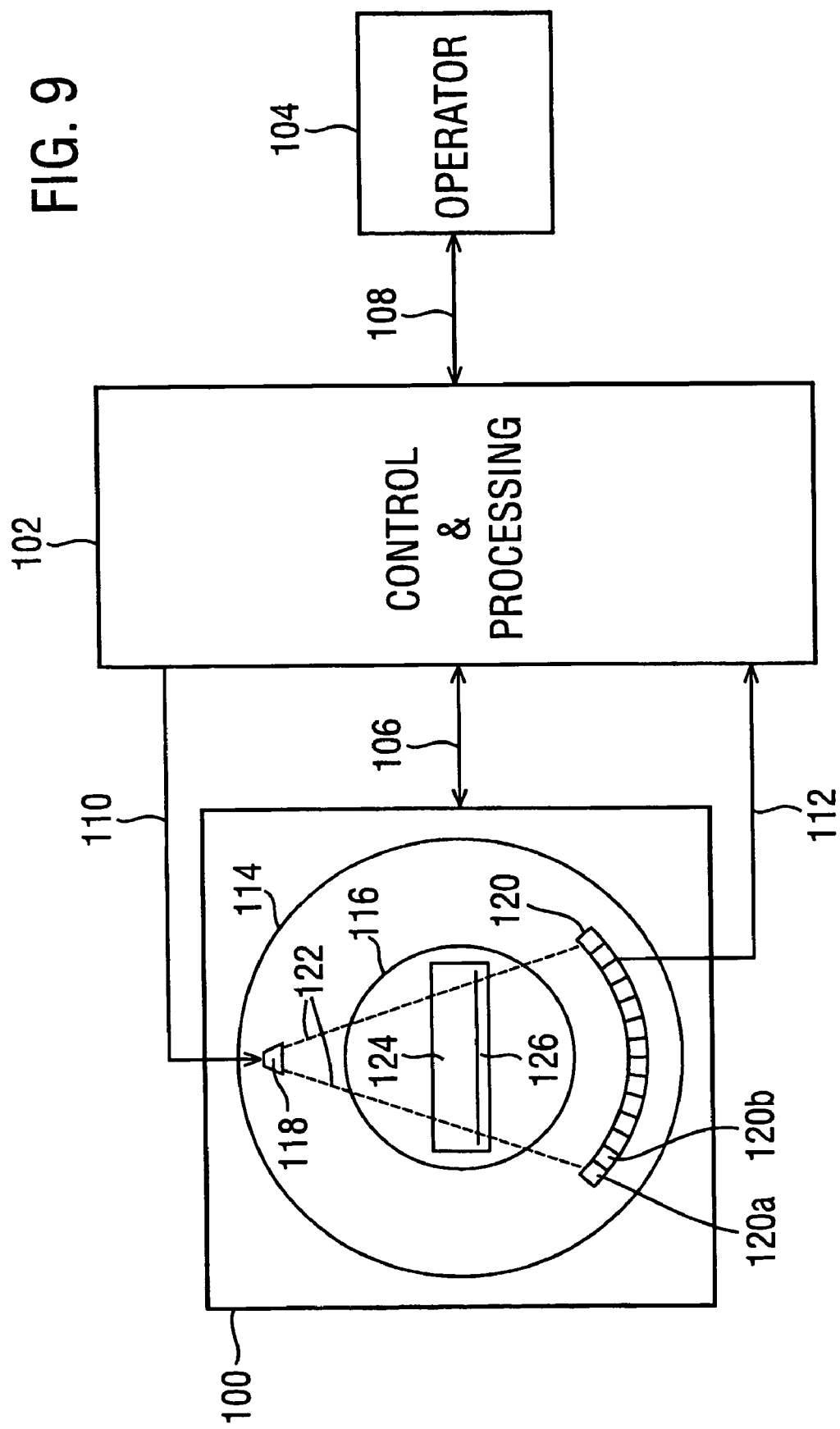
FIG. 9 illustrates a CT imaging system or machine within which the present invention may be advantageously incorporated in an embodiment.

The arrays 80*a* to 80*d* and 82*a* to 82*d* can be considered as sub-arrays, which together form a photo-detector array. The sub-arrays can be considered to form a matrix which forms a photo-detector array. The matrix effectively extends in two-dimensions, although in practice, as can be seen in FIG. 9 below, the matrix is curved such that the array extends in a third dimension.

Whilst the present invention has been described in relation to particular processing techniques for forming the advantageous structures of the present invention, it is not limited to such a techniques. A chemical or mechanical method may be utilized to manufacture the openings through the semiconductor substrate. Although sawing by a wafer dicing saw and etching by inductively coupled plasma are foreseen as a practical solutions to manufacturing the openings, other mechanical and chemical methods including drilling, machining, spark erosion, laser cutting or chemical etching methods other than inductively coupled plasma etching may also be used.

The invention enables the manufacture of fully 'tileable' detector structures with highly uniform detector properties.

The present invention has been described herein by way of reference to specific, non-limiting examples. For example, the invention is more generally applicable than the described application to photo-detectors in imaging systems. In addition, the invention is not limited to any particular material given herein by way of example. The invention is more generally applicable to the formation of an array of devices in substrates, wafers and semiconductors. The invention, however, is clearly advantageously applicable in implementations requiring arrays of semiconductor devices that must be connected off the device.

Referring to FIG. 9, there is illustrated the main elements of a CT imaging machine within which a photo-detector array may be constructed in accordance with a preferred embodiment of the invention, and advantageously utilized. The construction of such machines is well-known in the art, and will be familiar to one skilled in the art. Only the main elements of such a machine are shown in FIG. 9, to illustrate the use of the present invention.

The machine principally comprises a scanner generally designated by reference numeral 100, a control and processing means generally designated by reference numeral 102, and an operator interface generally designated by reference numeral 104.

The scanner 100 generally comprises a cylindrical structure 114, a cross-section through which is illustrated in FIG. 9. Within the cylindrical structure 114 there is mounted an x-ray source 118 and an array of photo-detectors 120. The array of photo-detectors 120 comprises a plurality of arrays such as the arrays 80 of FIG. 8. Thus the array 120 is made up of a plurality of arrays 120*a*, 120*b* etc. In the arrangement of FIG. 9, the photo-detector arrays 120*a*, 120*b* etc are implemented in a tiled structure in accordance with the present invention, and the arrays are connected not only in the plane shown in the cross-section of FIG. 9, but also in the z-direction, i.e. into the page along the length of the cylindrical structure 114.

The X-ray source 118 emits X-rays under the control of a signal on line 110 from the control and processing means 102. The X-rays, having a radiation pattern in cross-section generally designated by dashed lines 122, have a footprint which falls onto the photo-detector array 120, which in accordance with the techniques of the present invention extends in the direction of the cylindrical axis, as well as in the direction shown in the cross-section of FIG. 9. The outputs from the photo-detectors are provided to the control and processing means 102 on a signal line 112.

An object to be imaged, such as a patient 124, is placed on a table 126 which is typically moved through the imaging machine in the z-direction. In utilizing a photo-detector array in accordance with the present invention, any movement of the table may be reduced or rendered unnecessary.

The control and processing means 102 includes all necessary means for controlling the mechanical and electronic operation of the scanner 100, including the means for controlling the X-ray source 118 and for processing signals received from the photo-detector array 120. Additional transfer of signals between the control and processing means and the scanner 100 are represented by signal connections 106.

The operator interface 104 communicates with the control and processing means, as represented by signals 108. The operator interface 104 preferably is used to control the operation of the scanner 100, and display results of the scanning process.

FIG. 9 represents one useful application of a photo-detector array constructed in accordance with the principles of a preferred embodiment of the present invention. Other useful and advantageous applications will be apparent to one skilled in the art.

It should be understood that the invention is more generally applicable than the examples given herein. One skilled in the art will understand the broader applicability of the present invention. The scope of the invention is defined by the appended claims.

The invention claimed is:

1. An array of photodiodes extending in two dimensions and comprising:
    a plurality of substrates;
    a corresponding plurality of anodes formed at first surfaces of the plurality of substrates;
    a corresponding plurality of cathodes formed at second surfaces of the plurality of substrates, wherein a bulk of each substrate is disposed between a corresponding anode and cathode;
    an electrical interconnection between the plurality of anodes; and a connector interface provided with a corresponding plurality of contacts electrically connected to the respective cathodes for reading output signals provided by the plurality of cathodes.

2. An array according to claim 1, wherein the plurality of substrates are formed by dividing a single substrate.

3. An array according to claim 1, wherein a passivation layer connects the plurality of substrates.

4. An array according to claim 1, wherein the plurality of cathodes comprise a plurality of conductive layers formed at the surface of the substrate.

5. An array according to claim 4, wherein there is further provided a metal layer on each conductive layer.

6. An array according to claim 1, wherein the plurality of anodes comprise a plurality of active regions formed at the first surface.

7. An array according to claim 6, wherein there is further provided a metal contact for each active region.

8. An array according to claim 1, wherein the electrical interconnection is provided by one of: wire bonding, metal contacts, or a conductive sheet.

9. An array according to claim 1, wherein the plurality of substrates is formed on the connector interface.

10. An array according to claim 1, wherein the plurality of contacts are connected to the plurality of cathodes by an epoxy.

11. An imaging system including an array of photodiodes and a connector interface, the array of photodiodes extending in two dimensions and comprising:
- a plurality of substrates;
- a corresponding plurality of anodes formed at first surfaces of the plurality of substrates;
- a corresponding plurality of cathodes formed at second surfaces of the plurality of substrates, wherein a bulk of each substrate is disposed between a corresponding anode and cathode; and
- an electrical interconnection between the plurality of anodes;
- wherein the connector interface is provided with a corresponding plurality of contacts electrically connected to the respective cathodes for reading output signals provided by the plurality of cathodes.

12. A computed tomography imaging system including an array of photodiodes and a connector interface, the array of photodiodes extending in two dimensions and comprising:
- a plurality of substrates;
- a corresponding plurality of anodes formed at first surfaces of the plurality of substrates;
- a corresponding plurality of cathodes formed at second surfaces of the plurality of substrates, wherein a bulk of each substrate is disposed between a corresponding anode and cathode; and
- an electrical interconnection between the plurality of anodes;
- wherein the connector interface is provided with a corresponding plurality of contacts electrically connected to the respective cathodes for reading output signals provided by the plurality of cathodes.

13. A photo-detector array including a plurality of sub-arrays of photo-diodes, each sub-array of photodiodes extending in two dimensions and comprising:
- a plurality of substrates;
- a corresponding plurality of anodes formed at first surfaces of the plurality of substrates;
- a corresponding plurality of cathodes formed at second surfaces of the plurality of substrates, wherein a bulk of each substrate is disposed between a corresponding anode and cathode;
- an electrical interconnection between the plurality of anodes; and
- a connector interface provided with a corresponding plurality of contacts electrically connected to the respective cathodes for reading output signals provided by the plurality of cathodes;
- wherein the plurality of said sub-arrays of photo-diodes are placed adjacent to each other in a matrix to form the photo-detector array.

14. A photo-detector array according to claim 13 wherein the matrix extends in two directions.

15. An imaging system comprising:
- a radiation detector having a photo detector array including a plurality of sub-arrays of photo-diodes placed adjacent to each other in a matrix to form the photo-detector array;
- a radiation source facing the radiation detector; and
- means for controlling the radiation detector and the radiation source;
- wherein each sub-array of photodiodes extends in two dimensions and comprises:
  - a plurality of substrates;
  - a corresponding plurality of anodes formed at first surfaces of the plurality of substrates;
  - a corresponding plurality of cathodes formed at second surfaces of the plurality of substrates, wherein a bulk of each substrate is disposed between a corresponding anode and cathode;
  - an electrical interconnection between the plurality of anodes; and
  - a connector interface provided with a corresponding plurality of contacts electrically connected to the respective cathodes for reading output signals provided by the plurality of cathodes.

16. An imaging system according to claim 15, wherein the radiation source is an X-ray tube equipped with a high-voltage generator.

17. An imaging system according to claim 15, wherein the radiation detector and the radiation source are radially mounted in a cylindrical scanning structure.

18. An imaging system according to claim 15, wherein the means for controlling comprises a computer system.

19. A method of forming an array of photodiodes extending in two directions, comprising:
- forming a substrate;
- forming a plurality of anodes at a first surface of the substrate;
- forming a corresponding plurality of cathodes at a second surface of the substrate, wherein a bulk of the substrate is disposed between the plurality of anodes and the plurality of cathodes;
- providing a connector interface comprising a corresponding plurality of contacts;
- electrically connecting the plurality of contacts to the respective cathodes, wherein the plurality of cathodes provide the plurality of output signals of the array; and then:
- dividing the substrate into a corresponding plurality of substrates; electrically interconnecting the plurality of anodes.

20. A method according to claim 19, wherein the step of forming a plurality of cathodes comprises providing a plurality of conductive layers on the second surfaces of the plurality of substrates.

21. A method according to claim 20, wherein the plurality of conductive layers are formed by providing a continuous conductive layer on the second surface of the single substrate, and electrically isolating portions of the continuous layer to form the plurality of conductive layers.

22. A method according to claim 21, wherein the portions of the conductive layer are electrically isolated by etching or cutting the continuous conductive layer.

23. A method according to claim 22, wherein the step of etching or cutting further etches the substrate.

24. A method according to claim 23, wherein the substrate is etched or cut completely.

25. A method according to claim 24 wherein there is thus formed a plurality of isolated substrate portions.

26. A method according to claim 22, wherein the etch or cut is patterned such that a contiguous area is etched or cut around each cathode.

27. A method according to claim 23, wherein a passivation layer on the first surface of the substrate is unaffected by the etch or cut.

28. A method according to claim 19, wherein the step of interconnecting the plurality of anodes includes providing between the plurality of anodes one of: wire bonding, a metal interconnect, or a conductive sheet over the first surfaces.

29. A method according to claim 19, wherein the connector interface comprises one of: a plurality of pads for connection to the plurality of cathodes, a substrate, or an integrated circuit.

30. A method of forming an array of photodiodes extending in two directions, comprising:
    forming a plurality of substrates;
    forming a corresponding plurality of anodes at first surfaces of the plurality of substrates;
    forming a corresponding plurality of cathodes at second surfaces of the plurality of substrates, wherein a bulk of each substrate is disposed between a corresponding anode and cathode;
    electrically interconnecting the plurality of anodes;
    providing a connector interface comprising a corresponding plurality of contacts; and
    electrically connecting the plurality of contacts to the respective cathodes, wherein the plurality of cathodes provide the plurality of output signals of the array.

31. A method according to claim 30, wherein the step of interconnecting the plurality of anodes includes providing between the plurality of anodes one of: wire bonding, a metal interconnect, or a conductive sheet over the first surfaces.

32. A method according to claim 31, wherein the connector interface comprises one of: a plurality of pads for connection to the plurality of cathodes, a substrate, or an integrated circuit.

33. A semiconductor packaging structure comprising an array of photo-diodes and a connector interface, the array of photo-diodes extending in two dimensions and comprising:
    a plurality of substrates;
    a corresponding plurality of anodes formed at first surfaces of the plurality of substrates;
    a corresponding plurality of cathodes formed at second surfaces of the plurality of substrates, wherein a bulk of each substrate is disposed between a corresponding anode and cathode; and
    an electrical interconnection between the plurality of anodes;
    wherein the connector interface is provided with a corresponding plurality of contacts electrically connected to the respective cathodes for reading output signals provided by the plurality of cathodes.

34. A radiation detector comprising at least one array of photodiodes, at least one of said at least one array of photo-diodes extending in two dimensions and comprising:
    a plurality of substrates;
    a corresponding plurality of anodes formed at first surfaces of the corresponding plurality of substrates;
    a corresponding plurality of cathodes formed at second surfaces of the plurality of substrates, wherein a bulk of each substrate is disposed between a corresponding anode and cathode;
    an electrical interconnection between the plurality of anodes; and
    a connector interface provided with a corresponding plurality of contacts electrically connected to the respective cathodes for reading output signals provided by the plurality of cathodes.

35. An intermediate photodiode structure comprising:
    a plurality of substrates;
    a corresponding plurality of anodes formed at first surfaces of the plurality of substrates, without a layer of optically transparent material over the surface of such;
    a corresponding plurality of cathodes formed at second surfaces of the plurality of substrates, wherein a bulk of each substrate is disposed between a corresponding anode and cathode;
    an electrical interconnection between the plurality of anodes; and
    a connector interface provided with a corresponding plurality of contacts electrically connected to the respective cathodes for reading output signals provided by the plurality of cathodes.

* * * * *